(12) United States Patent
Kim et al.

(10) Patent No.: US 6,461,937 B1
(45) Date of Patent: *Oct. 8, 2002

(54) METHODS OF FORMING TRENCH ISOLATION REGIONS HAVING RECESS-INHIBITING LAYERS THEREIN THAT PROTECT AGAINST OVERETCHING

(75) Inventors: Sung-eui Kim, Kyungki-do; Keum-joo Lee, Incheon; In-seak Hwang, Kyungki-do; Young-sun Koh, Kyungki-do; Dong-ho Ahn, Kyungki-do; Moon-han Park, Kyungki-do; Tai-su Park, Kyungki-do, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/479,442

(22) Filed: Jan. 7, 2000

(30) Foreign Application Priority Data

Jan. 11, 1999 (KR) .................................. 99-391
May 26, 1999 (KR) ............................. 99-19023

(51) Int. Cl.$^7$ .................................. H01L 21/76
(52) U.S. Cl. ........................ 438/431; 438/435
(58) Field of Search .................. 438/424, 431, 438/435

(56) References Cited

U.S. PATENT DOCUMENTS

| | | | | |
|---|---|---|---|---|
| 4,571,819 A | * | 2/1986 | Rogers et al. | 29/576 |
| 4,952,524 A | | 8/1990 | Lee et al. | 437/67 |
| 5,189,501 A | | 2/1993 | Kawamura et al. | 257/647 |
| 5,190,889 A | | 3/1993 | Poon et al. | 437/67 |
| 5,206,182 A | | 4/1993 | Freeman | 437/33 |
| 5,447,884 A | | 9/1995 | Fahey et al. | 437/67 |
| 5,521,422 A | | 5/1996 | Mandelman et al. | 257/510 |

(List continued on next page.)

FOREIGN PATENT DOCUMENTS

| | | | |
|---|---|---|---|
| JP | 61137338 A | * 12/1984 | H01L/21/76 |
| JP | 10-214889 | 8/1998 | |

OTHER PUBLICATIONS

U.S. patent application Ser. No. 09/306,496, Oh, filed May 6, 1999.

(List continued on next page.)

*Primary Examiner*—Olik Chaudhuri
*Assistant Examiner*—David S Blum
(74) *Attorney, Agent, or Firm*—Myers Bigel Sibley & Sajovec

(57) ABSTRACT

Methods of forming trench isolation regions include the steps of forming a semiconductor substrate having a trench therein and a masking layer thereon extending adjacent the trench. The masking layer may comprise silicon nitride. A recess-inhibiting layer is then formed on a sidewall of the trench and on a sidewall of the masking layer. Next, a stress-relief layer is formed on the recess-inhibiting layer. This stress-relief layer extends opposite the sidewall of the trench and opposite the sidewall of the masking layer and may comprise silicon nitride. The trench is then filled with a trench isolation layer. A sequence of planarization or etch-back steps are then performed to remove the masking layer and also align an upper surface of the trench isolation layer with a surface of the substrate. At least a portion of the masking layer is removed using a first etchant (e.g., phosphoric acid) that selectively etches the masking layer and the stress-relief layer at faster rates than the first recess-inhibiting layer. The recess-inhibiting layer is formed directly on a sidewall of the masking layer in order to limit the extent to which the outer surfaces of the stress-relief layer are exposed to the first etchant. In this manner, recession of the stress-relief layer and the voids that may subsequently develop as a result of the recession can be reduced. Multiple thin stress-relief layers may also be provided and these multiple layers provide a degree of stress-relief that is comparable with a single much thicker stress-relief layer.

7 Claims, 15 Drawing Sheets

U.S. PATENT DOCUMENTS

| | | | |
|---|---|---|---|
| 5,554,256 A | 9/1996 | Pruijmboom et al. | 156/643.1 |
| 5,578,518 A | 11/1996 | Koike et al. | 437/67 |
| 5,677,234 A | 10/1997 | Koo et al. | 437/69 |
| 5,712,185 A | 1/1998 | Tsai et al. | 437/67 |
| 5,747,866 A | 5/1998 | Ho et al. | 257/506 |
| 5,750,433 A | 5/1998 | Jo | 438/424 |
| 5,753,562 A | 5/1998 | Kim | 438/424 |
| 5,780,346 A * | 7/1998 | Arghavani et al. | 438/296 |
| 5,801,083 A | 9/1998 | Yu et al. | 438/424 |
| 5,834,358 A | 11/1998 | Pan et al. | 438/424 |
| 5,837,595 A | 11/1998 | Ahn et al. | 438/443 |
| 5,837,612 A | 11/1998 | Ajuria et al. | 438/697 |
| 5,858,842 A | 1/1999 | Park | 438/297 |
| 5,863,827 A | 1/1999 | Joyner | 438/425 |
| 5,872,045 A * | 2/1999 | Lou et al. | 438/432 |
| 5,882,982 A | 3/1999 | Zheng et al. | 438/424 |
| 5,885,883 A | 3/1999 | Park et al. | 438/435 |
| 5,940,716 A | 8/1999 | Jin et al. | 438/424 |
| 5,985,735 A * | 11/1999 | Moon et al. | 438/435 |
| 6,136,664 A * | 10/2000 | Economikos et al. | 438/431 |
| 6,251,746 B1 * | 6/2001 | Hong et al. | 438/424 |

OTHER PUBLICATIONS

U.S. patent application Ser. No. 09/271,837, Koo et al., filed Mar. 18, 1999.

Notice to Submit Response, Korean Application No. 1999-19023, Mar. 29, 2001.

* cited by examiner

US 6,461,937 B1

METHODS OF FORMING TRENCH ISOLATION REGIONS HAVING RECESS-INHIBITING LAYERS THEREIN THAT PROTECT AGAINST OVERETCHING

RELATED APPLICATION

This application is related to Korean Application No. 99-391, filed Jan. 11, 1999 and Korean Application No. 99-19023, filed May 26, 1999, the disclosures of which are hereby incorporated herein by reference.

FIELD OF THE INVENTION

This invention relates to integrated circuit device fabrication methods and, more particularly, to methods of forming field oxide isolation regions in semiconductor substrates.

BACKGROUND OF THE INVENTION

Improved active device isolation techniques are desired in order to facilitate ongoing attempts to increase integration density in integrated circuit devices by designing devices having reduced unit cell size. Conventional device isolation techniques include local oxidation of silicon (LOCOS) and shallow trench isolation (STI) techniques, for example. Such device isolation techniques are disclosed in U.S. Pat. Nos. 5,677,234, 5,750,433, 5,753,562, 5,837,595, 5,858,842 and 5,885,883.

But, such techniques as LOCOS may not be appropriate for state-of-the-art high integration devices because they typically result in the formation of isolation regions having bird's beak oxide extensions which typically consume relatively large amounts of surface area. To address this and other problems, STI techniques have been developed. One such technique is illustrated by FIGS. 30A–30E. In particular, FIG. 30A illustrates the steps of forming a pad oxide layer 3, a pad nitride layer 4, a high temperature oxide (HTO) layer 5 and an anti-reflective layer 6 on a semiconductor substrate 2. A photoresist layer 10 is then patterned on the anti-reflective layer 6. A trench mask 8 is then formed by performing an etching step using the patterned photoresist layer 10 as an etching mask. As illustrated by FIG. 30B, another etching step is then performed to define a trench 12 in the substrate 2, using the trench mask 8 as a etching mask. During the etching step, the anti-reflective layer 6 may also be removed.

Referring now to FIG. 30C, a thermal oxide layer 14 is then formed in the trench to remove etching damage. A trench isolation layer comprising an undoped silicate glass (USG) layer 15 and a PE-TEOS oxide layer 16 (for reducing stress in the USG layer), is then formed to fill the trench 12. As illustrated by FIG. 30D, a planarization step (e.g., CMP) is then performed, using the pad nitride layer 4 as an etch stop layer. Then, as illustrated by FIG. 30E, the pad nitride layer 4 and pad oxide layer 3 are sequentially removed to define a trench isolation region 18

Unfortunately, because the substrate 2 may have a substantially different coefficient of thermal expansion than the USG layer 15 in the trench 12, substantial stresses may develop in the substrate 2 during back-end processing. These stresses may adversely influence the device characteristics of active devices formed in active regions extending adjacent the trench isolation region 18. The subsequent formation of an oxide layer on the active regions (e.g., gate oxide layers) may also act to increase the degree of stress in the substrate 2, due to volume expansion in the trench isolation region 18. Grain dislocation defects and pits may also be generated at the bottom corners and sidewalls of the trench in response to the volume expansion. Such defects may lead to increases in junction leakage currents in adjacent active devices, and decreases in reliability and yield.

To inhibit the formation of grain dislocations and pits at the corners and sidewalls of the trench isolation regions during back end processing steps, silicon nitride layers have been used in trench isolation regions to provide stress relief. Such silicon nitride stress relief layers are described in U.S. Pat. No. 5,447,884 to Fahey et al., entitled "Shallow Trench Isolation With Thin Nitride Liner". FIG. 1 is also a graph that illustrates the reduction in junction leakage currents that may occur when silicon nitride stress relief layers (SiN) are provided in trench isolation regions. Here, the leakage currents were measured as the drain "off" currents for MOSFETs formed adjacent a trench isolation region. These currents were measured by grounding the gate electrode, the source region and the substrate and applying a voltage of 3.3 volts to the drain region of the MOSFET. In FIG. 1, the symbols -□- designate the leakage currents when silicon nitride stress relief layers are not used and the symbols -○- designate the leakage currents when silicon nitride stress relief layers are provided.

Referring now to FIGS. 2–4, a conventional method of forming a trench isolation region having a silicon nitride stress-relief layer therein will be described. In particular, FIG. 2 illustrates the steps of forming a pad oxide layer 53 on a surface of a semiconductor substrate 51 and then forming a silicon nitride masking layer 55 on the pad oxide layer. A conventional etching step is then performed to etch a trench in the substrate 51, using the masking layer 53 as an etching mask. The sidewalls and bottom of the trench are then thermally oxidized to define a sidewall insulating layer 56. A blanket silicon nitride stress-relief layer 57 is then deposited onto the sidewall insulating layer 56 and onto a sidewall and upper surface of the masking layer 55. A relatively thick blanket trench isolation layer 59 is then deposited onto the stress-relief layer 57. The trench isolation layer 59 may comprise silicon dioxide and may be formed by a chemical vapor deposition (CVD) technique. A planarization step is then performed to etch back the trench isolation layer 59 and the stress-relief layer 57, using the masking layer 53 as a planarization stop layer. This planarization step may be performed by chemically-mechanically polishing (CMP) the trench isolation layer 59 and the stress-relief layer 57 until the masking layer 55 is exposed.

Referring now to FIG. 3, an isotropic wet etching step is then performed to selectively and preferably completely remove the masking layer 55 and expose the pad oxide layer 53. This etching step may be performed using an etchant that selectively etches silicon nitride at much higher rates than silicon dioxide (e.g., phosphoric acid $H_3PO_4$). However, during this etching step, the silicon nitride stress-relief layer 57 may also be etched in the vertical direction "V" and in the lateral direction "L" as the silicon nitride masking layer 55 is consumed. As illustrated, this vertical and lateral etching may cause the stress-relief layer 57 to become recessed to a level below the surface of the substrate 51. As will be understood by those skilled in the art, these recesses (or "dents") may adversely effect the isolation characteristics of the resulting trench isolation region if steps are not taken to fill the recesses with additional stress-relief material during subsequent processing steps. For example, the presence of the recesses may negatively impact the refresh characteristics of devices such as dynamic random access memory (DRAM) devices and may increase an inverse narrow width effect (INWE) in field effect transistors. Increases in INWE may also increase threshold voltage levels and cause a parasitic hump phenomenon to develop in the transistor's I-V characteristics. The presence of the recesses may also increase the likelihood that conductive bridges will be formed between adjacent active regions if the recesses become filled with electrically conductive material during subsequent process steps. In particular, if the degree of recession is significant enough, the recesses illustrated by region A in FIG. 4 may remain even after a selective etching step is performed to etch-back the pad oxide layer 53 and the trench isolation layer 59 and define a final trench isolation region having a planarized trench isolation layer 59' and silicon nitride stress-relief layer 57'.

Thus, notwithstanding the above described methods, there continues to be a need for improved methods of forming trench isolation regions and trench isolation regions formed thereby.

SUMMARY OF THE INVENTION

It is therefore an object of the present invention to provide improved methods of forming trench isolation regions and trench isolation regions formed thereby.

It is another object of the present invention to provide methods of forming trench isolation regions having reduced susceptibility to void defects therein and trench isolation regions formed thereby.

It is still another object of the present invention to provide methods of forming trench isolation regions having low stress characteristics and trench isolation regions formed thereby.

These and other objects, advantages and features of the present invention may be provided by methods of forming trench isolation regions that include the steps of forming a semiconductor substrate having a trench therein and a masking layer thereon extending adjacent the trench. The masking layer may comprise silicon nitride. A recess-inhibiting layer is then formed on a sidewall of the trench and on a sidewall of the masking layer. Next, a stress-relief layer is formed on the recess-inhibiting layer. This stress-relief layer extends opposite the sidewall of the trench and opposite the sidewall of the masking layer and may comprise silicon nitride. The trench is then filled with a trench isolation layer. A sequence of planarization or etch-back steps are then performed to remove the masking layer and also align an upper surface of the trench isolation layer with a surface of the substrate. In particular, at least a portion of the masking layer is removed using a first etchant (e.g., phosphoric acid) that selectively etches the masking layer and the stress-relief layer at faster rates than the first recess-inhibiting layer. According to a preferred aspect of the present invention, the recess-inhibiting layer is formed directly on a sidewall of the masking layer in order to limit the extent to which the outer surfaces of the stress-relief layer are exposed to the first etchant. In this manner, recession of the stress-relief layer and the voids that may subsequently develop as a result of the recession can be reduced. According to another preferred aspect of the present invention, multiple thin stress-relief layers are provided. These multiple stress-relief layers can provide a degree of stress-relief that is comparable with a single much thicker stress-relief layer. Moreover, the use of thin stress-relief layers can reduce the degree of recession that may occur with each layer by reducing the surface area of each stress-relief layer that is exposed to the first etchant when the masking layer is being removed.

According to another embodiment of the present invention, methods of forming trench isolation regions include the steps of forming a semiconductor substrate having a trench therein and a silicon nitride masking layer thereon surrounding the trench and then forming a silicon layer on the sidewall of the trench and on a sidewall and upper surface of the masking layer. The silicon layer, which may comprise polysilicon or amorphous silicon (a-Si), is then converted into a silicon dioxide recess-inhibiting layer using a thermal oxidation technique. A silicon nitride stress-relief layer is then formed on the recess-inhibiting layer. This step is then followed by the steps of forming a trench isolation layer on the stress-relief layer and removing the masking layer using a first etchant that selectively etches the masking layer and the stress-relief layer at faster rates than the recess-inhibiting layer. The trench isolation layer is then etched using a second etchant that selectively etches the trench isolation layer and the recess-inhibiting layer at faster rates than the stress-relief layer. Thus, according to this embodiment of the present invention, a preferred recess-inhibiting layer may be formed as a silicon dioxide layer by first depositing a silicon layer on a sidewall of the masking layer and then thermally oxidizing the silicon layer.

According to still a further embodiment of the present invention, trench isolation regions are provided having a plurality of thin silicon nitride stress-relief layers therein. Taken together, these plurality of stress-relief layers can provide a high degree of stress relief. Moreover, because each stress-relief layer is formed as a thin layer, the likelihood of substantial recession in response to chemical etching steps is reduced. In particular, trench isolation regions according to the present invention include a semiconductor substrate having a trench therein and an electrically insulating trench isolation layer in the trench. In addition, a plurality of silicon nitride stress-relief layers and a plurality of silicon dioxide recess-inhibiting layers are disposed in alternating sequence between the trench isolation layer and a sidewall of the trench. The plurality of silicon nitride stress-relief layers may have respective thicknesses of less than about 200Å.

DESCRIPTION OF PREFERRED EMBODIMENTS

Figure 1:
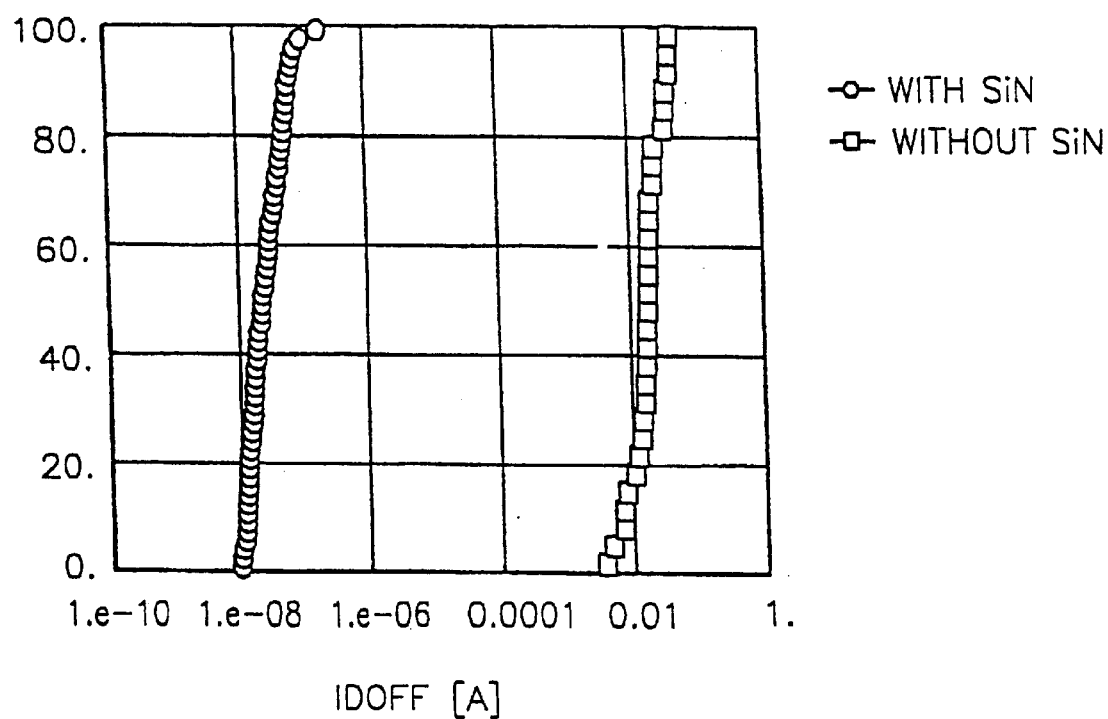
FIG. 1 is a graph illustrating leakage current characteristics for trench isolation regions formed with and without silicon nitride stress-relieving layers.
Figure 2:
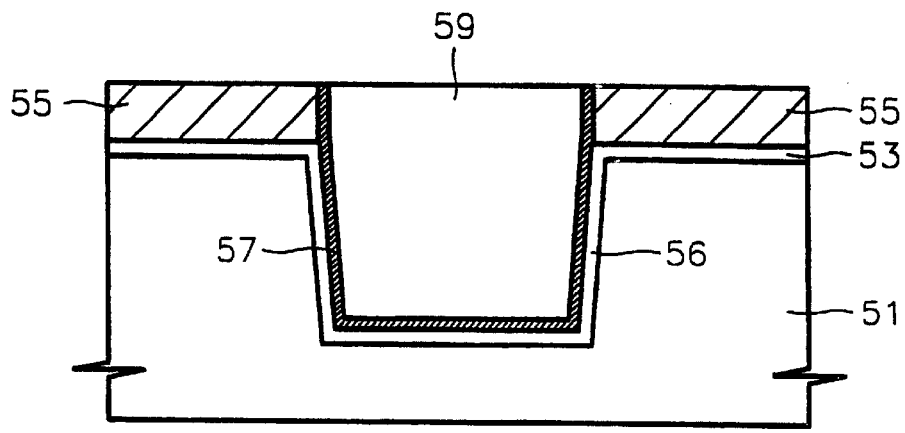
FIGS. 2–4 are cross-sectional view of intermediate structures that illustrate a conventional method of forming a trench isolation region having a silicon nitride stress-relieving layer therein.
Figure 3:
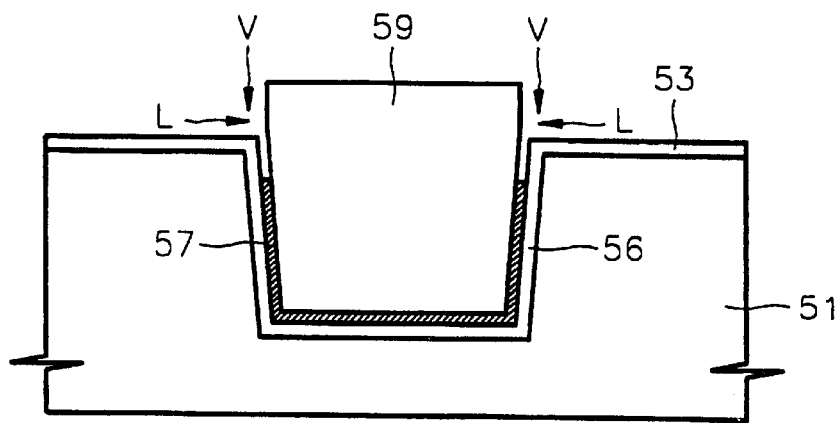
Figure 4:
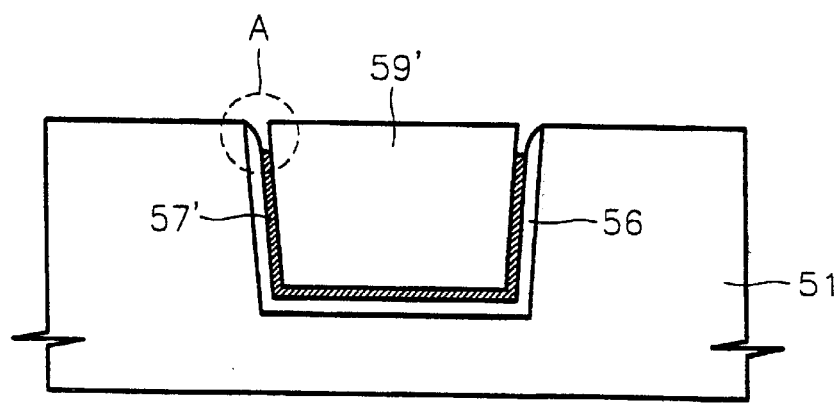

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 6:
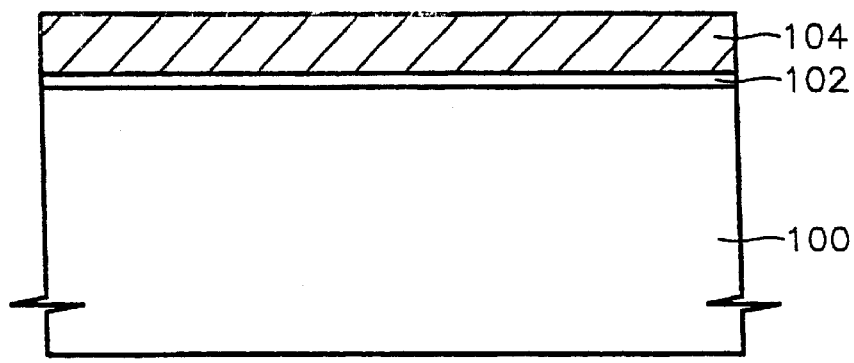
FIGS. 6–10 are cross-sectional views of intermediate structures that illustrate methods of forming trench isolation regions according to a first embodiment of the present invention.

Referring now to FIGS. 6–10, preferred methods of forming trench isolation regions according to a first embodiment of the present invention will be described. In particular, FIG. 6 illustrates the step of forming a silicon nitride ($Si_3N_4$) layer 104 a semiconductor substrate 100. This silicon nitride layer 104 may be formed by depositing a silicon nitride layer 104 having a thickness in a range between about 500 Å and 3000 Å using a low pressure chemical vapor deposition (LPCVD) technique. As illustrated, this step of forming a silicon nitride layer 104 may be preceded by the step of forming a pad oxide layer 102 on the face of the substrate 100. This pad oxide layer 102 maybe formed to have a thickness in a range between about 100 Å and 500 Å, by thermally oxidizing the face of the substrate 100 at a temperature of about 900° C. Although not shown, an additional oxide layer having a thickness in a range between about 150and 1500 Å may be formed on the silicon nitride layer 104 and used as an anti-reflective coating (ARC) to enhance the accuracy of photolithographically defined patterning steps, for example. This oxide layer may comprise a high temperature oxide (HTO) layer or a silicon oxynitride (SiON) layer or a composite of these materials.

Figure 7:
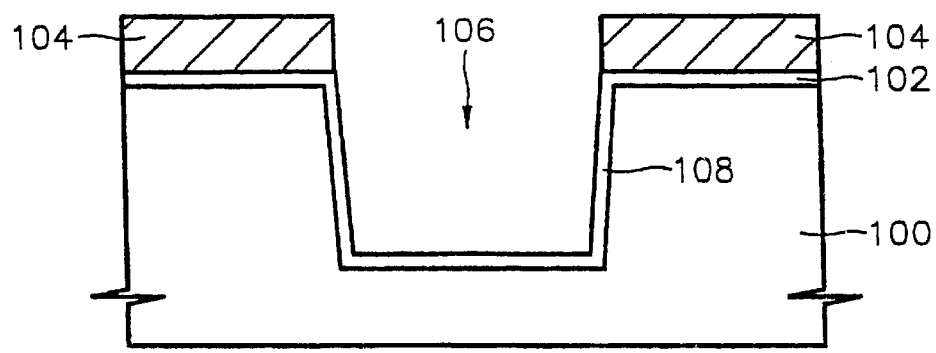

Referring now to FIG. 7, a photolithographically defined etching step may then be performed to pattern the silicon nitride layer 104 as a trench masking layer. Then, using the trench masking layer 104 as an etching mask, a trench 106 is formed in the substrate 100 using conventional etching techniques, as illustrated. Next, a thermal oxidation step may be performed to form a sidewall insulating layer 108 the sidewalls and bottom of the trench 106. This sidewall insulating layer 108 is preferably formed in order to remove etching damage from the substrate 100. This sidewall insulating layer 108 may have a thickness in a range between about 30 Å and 50 Å. As will be understood by those skilled in the art, the trench 106 may also be formed by patterning the silicon nitride layer 104 (as a trench masking layer) using a photoresist mask and then removing the photoresist mask with a conventional ashing technique. The trench masking layer 104 may then be used as a primary etching mask while the trench 106 is being etched using a chemical etchant, for example. The ARC layer (not shown) may also be used as a mask during the step of forming the trench 106.

Figure 8:
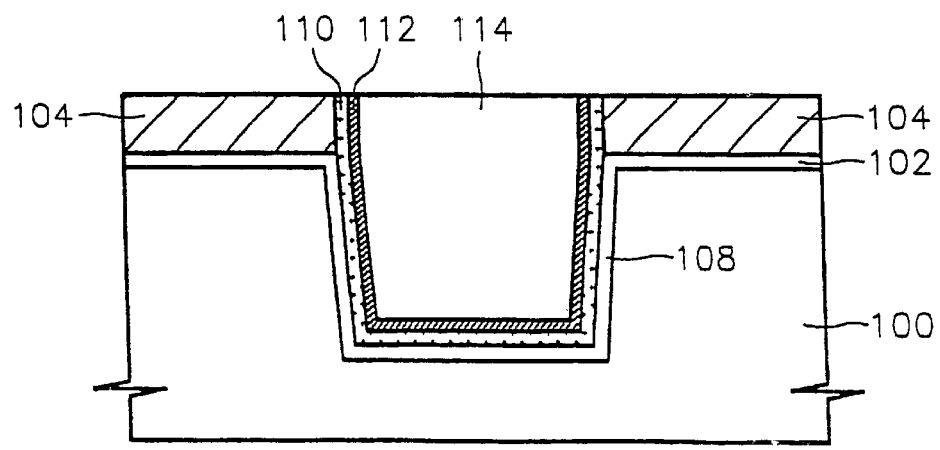

Referring now to FIG. 8, a recess-inhibiting layer 110 (e.g., dent free layer) is then preferably formed on the sidewall insulating layer 108 and on a sidewall and upper surface of the masking layer 104. This recess-inhibiting layer 110 is preferably formed by depositing a blanket oxide layer into the trench 106 and onto the sidewalls and upper surface of the trench masking layer 104. This blanket oxide layer may have a thickness in a range between about 10 Å and 300 Å. A stress-relief layer 112 (which reduces the magnitude of thermally-induced stresses during subsequent processing) is then formed on the recess-inhibiting layer 110 using a low pressure chemical vapor deposition (LPCVD) technique, for example. This stress-relief layer 112 may be formed as a silicon nitride layer having a thickness in a range between about 20 Å and 300 Å. Next, a high temperature oxide (HTO) layer (not shown) may be deposited on the stress-relief layer 112. This HTO layer may be formed at a high temperature in a range between about 700° C. and 900° C. and may have a thickness of about 100 Å. Ammonia plasma processing may also be performed on the HTO layer to inhibit thinning of and/or damage to the stress-relief layer 112 during subsequent processing. This plasma processing step need not be performed if a high density plasma (HDP) oxide layer is used in place of the HTO layer. Moreover, the step of forming an HTO layer or HDP oxide layer may be omitted.

Referring still to FIG. 8, a relatively thick blanket trench isolation layer 114 is then deposited on the stress-relief layer 112. This trench isolation layer may comprise an undoped silicate glass (USG) layer, a tetraethylorthosilicate (TEOS) glass layer, a high density plasma (HDP) oxide layer, a monosilane ($SiH_4$)-based CVD oxide layer or combinations thereof. After deposition of the trench isolation layer 114, an annealing step is preferably performed to densify the trench isolation layer 114 and make it less susceptible to being etched at too fast a rate by chemical etchants such as hydrofluoric acid (HF) or phosphoric acid ($H_3PO_4$). This annealing step is preferably performed at a temperature in a range between about 800° C. and 1150° C. Following this annealing step, the trench isolation layer 114, the stress-relief layer 112 and the recess-inhibiting layer110 are planarized using a conventional planarization step such as chemical mechanical polishing (CMP), however, other conventional etch-back steps may also be performed. During this planarization step, the trench masking layer 104 is used as a planarization-stop layer.

According to a preferred aspect of the present invention, the presence of the recess-inhibiting layer 110 acts to reduce the minimum required thickness of the stress-relief layer 112 and thereby reduces the rate at which the upper portions of the stress-relief layer 112 are etched back when chemical etching steps using wet etchants such as phosphoric acid are subsequently performed. Moreover, the presence of the recess-inhibiting layer 110 extending between the stress-relief layer 112 and the trench masking layer 104 limits the amount of surface area on the sides of the stress-relief layer 104 that is exposed to the wet etchant when the trench masking layer 104 is being etched back. In other words, the recess-inhibiting layer 110 acts to limit contact between the wet etchant and the silicon nitride stress relief layer 112 when the trench masking layer 104 is being etched. In contrast to this aspect of the present invention, the oxide layers that are formed on the sidewalls of the trenches in the prior art do not extend onto the sidewalls of the trench masking layer and, therefore, do not act to limit exposure of the nitride stress-relief layer to wet etchants when the trench masking layer is being etched back.

Figure 9:
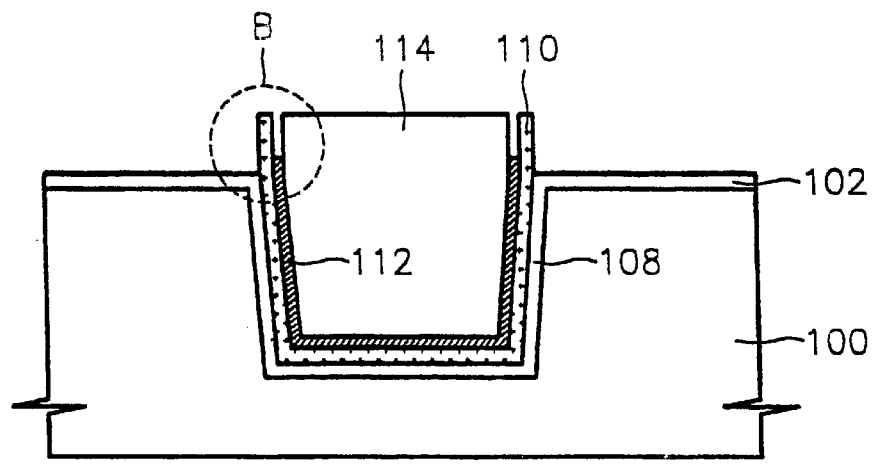
Figure 10:
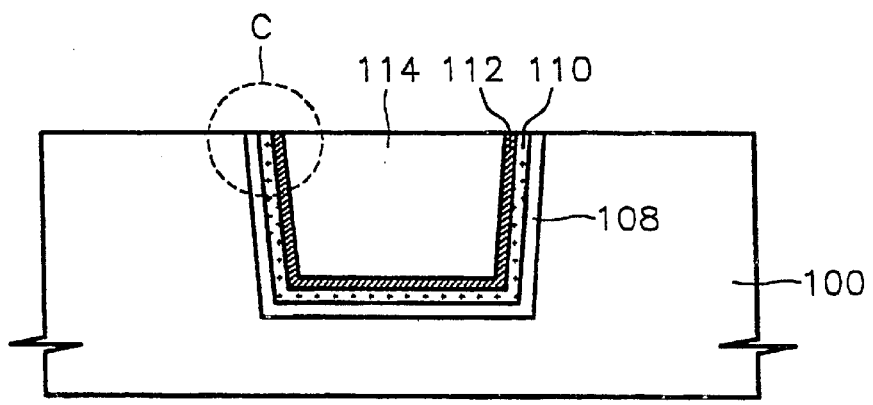

Referring now to FIG. 9, an etch back step is performed to remove the trench masking layer (which preferably comprises silicon nitride). In particular, a wet etching step is preferably performed on the structure of FIG. 8, using a phosphoric acid solution to selectively remove the trench masking layer 104 relative to the recess-inhibiting layer 110 and the trench isolation layer 114. Because this wet etching step is done with sufficient time margin to insure that all of the trench masking layer 104 is removed, it is desired that the exposed surface area of the stress-relief layer 112 be kept to a minimum in order to prevent excessive downward recession of the stress-relief layer 112 (i.e., the top of the stress-relief layer 112 in the highlighted region B should be maintained well above the surface of the substrate 100). Although less preferred, this isotropic wet etching step may be replaced by an anisotropic dry etching step.

After the etching step to remove the trench masking layer 104 is performed, another etch back step is performed to planarize the trench isolation layer 114 and the recess-inhibiting layer 110 and remove the pad oxide layer 102. This etch back step is preferably performed using a wet etchant that selectively etches oxide at a much faster rate than silicon nitride. As illustrated by the highlighted region C, this etch back step is performed without the presence of any remaining recesses (e.g., dents) in the stress-relief layer 104 that extend below the surface of the substrate 100 or extend between active portions of the substrate 100 and the trench isolation layer 114.

Figure 11:
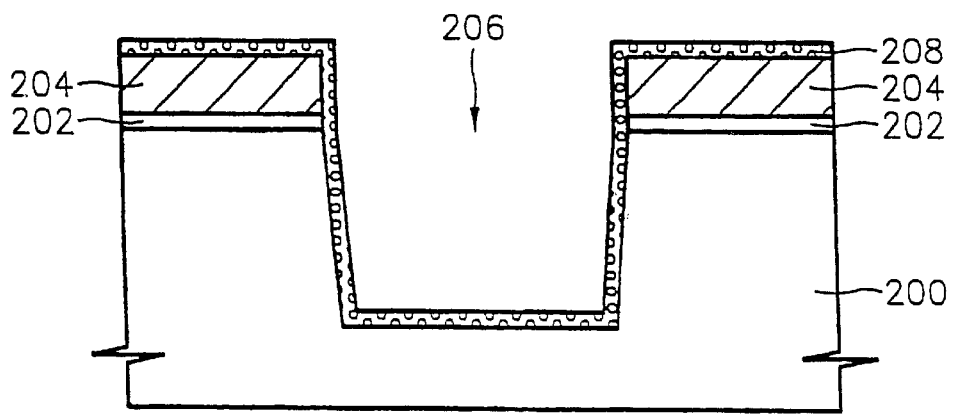
FIGS. 11–17 are cross-sectional views of intermediate structures that illustrate methods of forming trench isolation regions according to a second embodiment of the present invention.

Referring now to FIGS. 11–17, preferred methods of forming trench isolation regions according to a second embodiment of the present invention will be described. In particular, FIG. 11 illustrates the steps of forming a silicon nitride trench masking layer 204 on a semiconductor substrate 200. A pad oxide layer 202 may also be formed on the substrate 200 before the silicon nitride trench masking layer 204 is formed. As described above with respect to FIGS. 6–10, the trench masking layer 204 may be used as an etching mask during formation of a trench 206 in the substrate 200. An anti-reflective coating (not shown) may also be formed on the trench masking layer 204. After formation of the trench 206 a blanket silicon layer 208 is preferably deposited into the trench and onto the sidewalls and upper surface of the trench masking layer 204. This silicon layer 208 may be formed to have a thickness in a range between about 10 Å and 200 Å and may comprise amorphous silicon (a-Si) or, more preferably, polycrystalline silicon. For example, the silicon layer 208 may be deposited as a polycrystalline silicon layer using a LPCVD deposition technique. This deposition step may be performed in a chamber maintained at a temperature in a range between about 500° C. and 700° C. and at a pressure in a range between about 0.1 and 0.6 Torr. During the deposition step, the chamber is preferably supplied with a monosilane gas ($SiH_4$) at a flow rate of about 500 cc/min. Alternatively, the deposition step may be performed in an LPCVD chamber maintained at a temperature in a range between about 400° C. and 700° C. and at a pressure in a range between about 0.1 and 0.6 Torr, while supplying the chamber with a disilane gas ($Si_2H_6$) at a flow rate of about 50 sccm.

Figure 12:
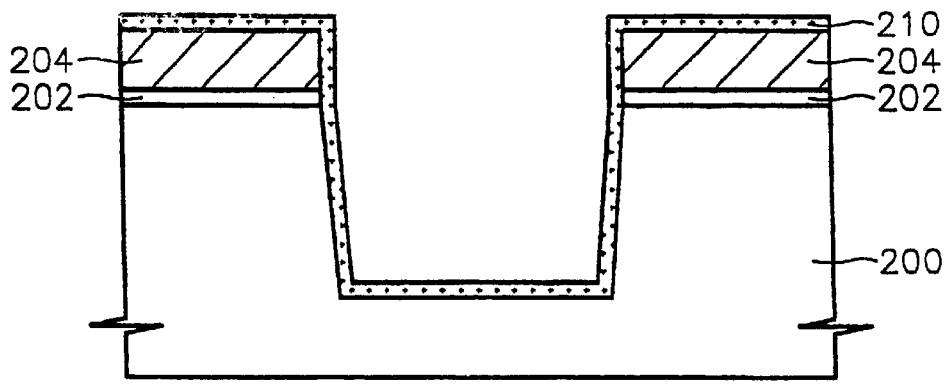

Referring now to FIG. 12, the silicon layer 208 is then thermally oxidized and converted into a recess-inhibiting oxide layer 210. Because the silicon layer 208 lines the sidewalls and bottom of the trench 206 and is electrically conductive, for isolation purposes it is desired that the duration of the thermal oxidation step be sufficient to convert all of the silicon layer 208 into an electrically insulating oxide layer 210. According to a preferred aspect of the present invention, this thermal oxidation step should be performed in an oxidation chamber maintained at atmospheric pressure and at a temperature in a range between about 800° C. and 1000° C., while supplying oxygen gas ($O_2$) to the chamber at a rate of 5 to 15 liters/min. and hydrogen chloride (HCl) gas at a rate of 0.05 to 0.2 liters/min.

Figure 13:
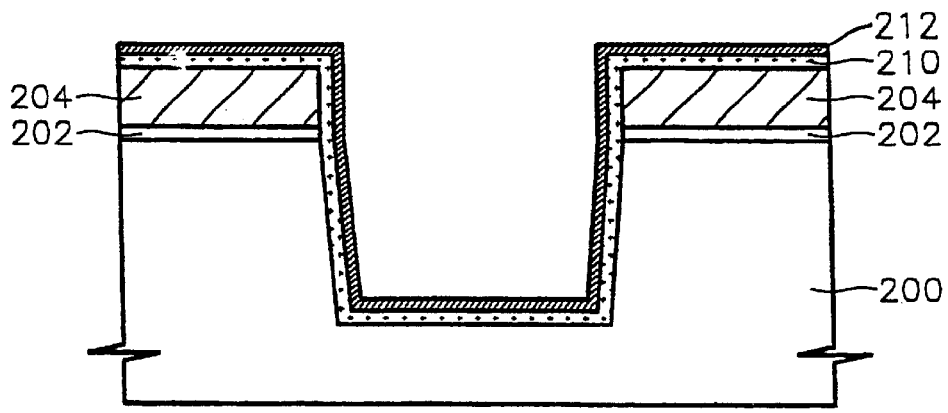

As illustrated by FIG. 13, a blanket silicon nitride stress-relief layer 212 then deposited on the recess-inhibiting oxide layer 210 using a LPCVD deposition method, for example. This stress-relief layer 212 is preferably formed to have a thickness in a range between about 20 Å and 300 Å. After deposition of the blanket stress-relief layer 212, a high temperature oxide (HTO) layer (not shown) may be deposited on the stress-relief layer 212. This HTO layer may be formed at a high temperature in a range between about 700° C. and 900° C. and may have a thickness of about 100 Å. Ammonia plasma processing may also be performed on the HTO layer to inhibit thinning of and/or damage to the stress-relief layer 212 during subsequent processing. This plasma processing step need not be performed if a high density plasma (HDP) oxide layer is used in place of the HTO layer. This step of forming an HTO layer or HDP oxide layer may be omitted altogether.

Figure 14:
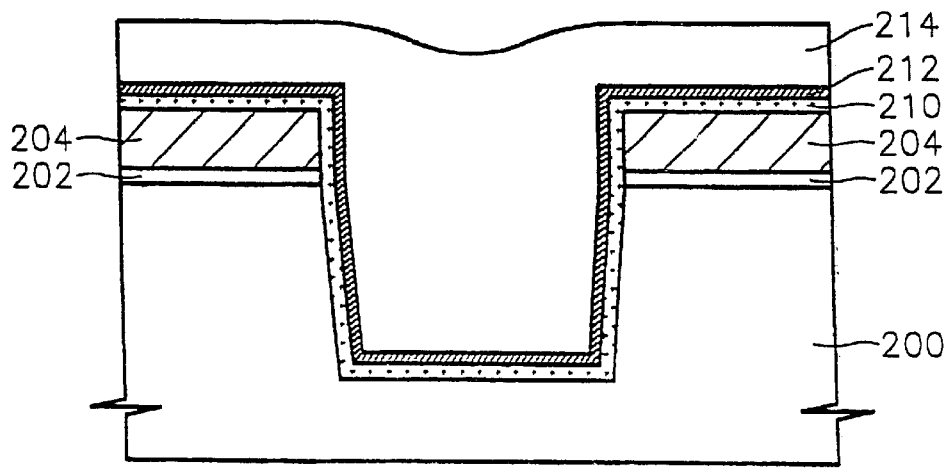
Figure 15:
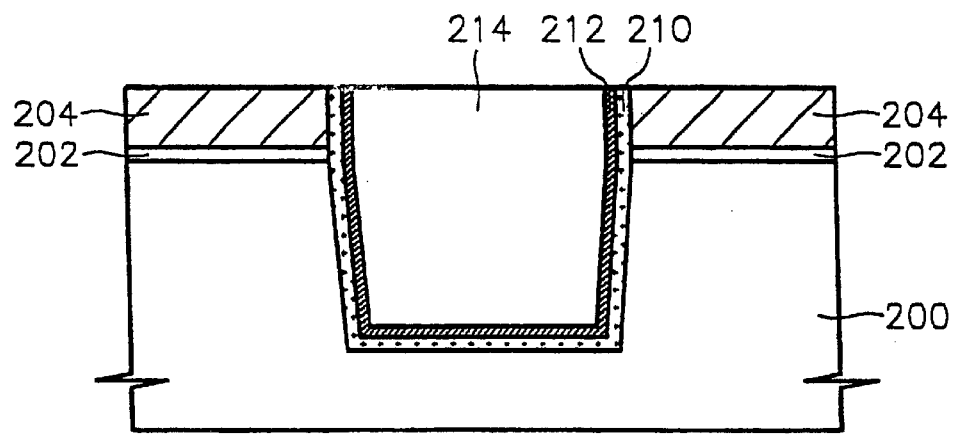

Referring now to FIG. 14, a relatively thick blanket trench isolation layer 214 is then deposited on the stress-relief layer 212. This trench isolation layer may comprise an undoped silicate glass (USG) layer, a tetraethylorthosilicate (TEOS) glass layer, a high density plasma (HDP) oxide layer, a monosilane ($SiH_4$)-based CVD oxide layer and combinations thereof. After deposition of the trench isolation layer 214, an annealing step is preferably performed to densify the trench isolation layer 214 and make it less susceptible to being etched at too fast a rate by chemical etchants such as hydrofluoric acid (HF) or phosphoric acid ($H_3PO_4$). This annealing step is preferably performed at a temperature in a range between about 800° C. and 1150° C. Then, as illustrated by FIG. 15, the trench isolation layer 214, the stress-relief layer 212 and the recess-inhibiting layer 210 are planarized using a conventional planarization step such as chemical mechanical polishing (CMP), however, other conventional etch-back steps may also be performed. During this planarization step, the trench masking layer 204 is used as a planarization-stop layer (i.e., the CMP step is completed when the trench masking layer 204 is exposed).

As described above with respect to the first embodiment of the present invention, the presence of the recess-inhibiting layer 210 acts to reduce the minimum required thickness of the stress-relief layer 212 and thereby reduces the rate at which the upper portions of the stress-relief layer 212 are etched back during subsequent chemical etching steps using wet etchants such as phosphoric acid. Moreover, the presence of the recess-inhibiting layer 210 between the stress-relief layer 212 and the trench masking layer 204 limits the amount of area on the outside vertical sidewalls of the stress-relief layer 212 that is exposed to the wet etchant as the trench masking layer 204 is being etched back.

Figure 16:
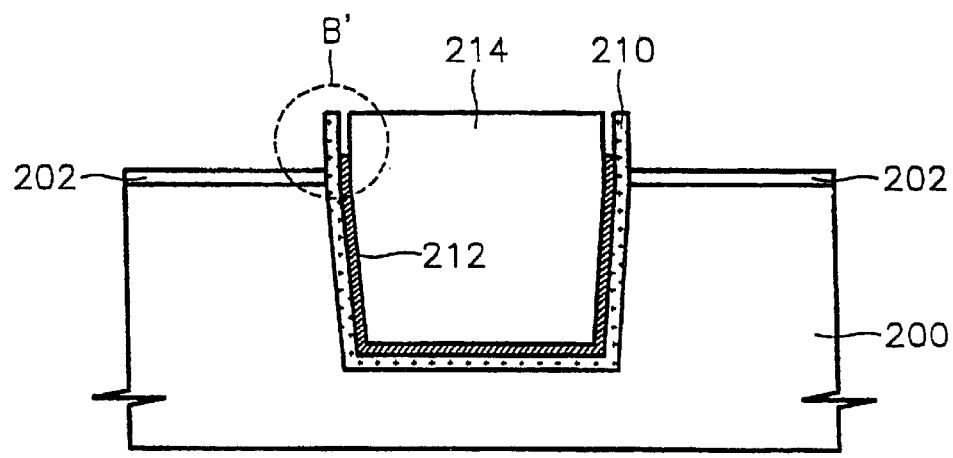
Figure 17:
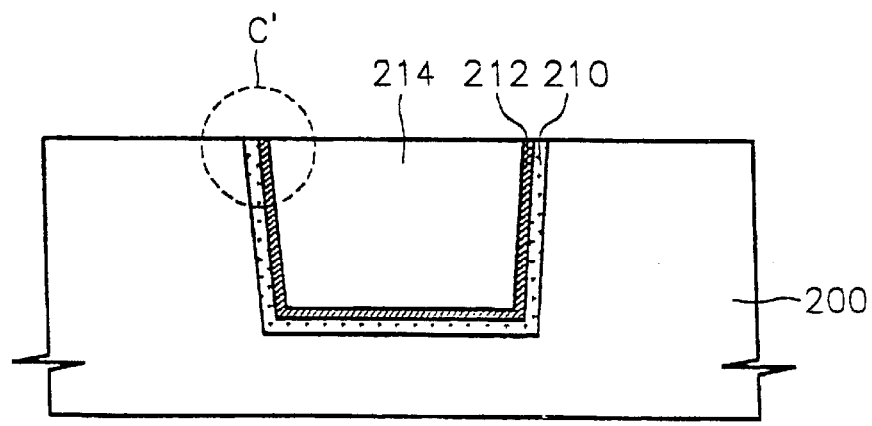

Referring now to FIG. 16, an etch back step is performed to remove the trench masking layer 204. In particular, a wet etching step is preferably performed on the structure of FIG. 15, using a phosphoric acid solution to selectively remove the trench masking layer 204 relative to the recess-inhibiting layer 210 and the trench isolation layer 214. Because this wet etching step is done with sufficient time margin to insure that all of the trench masking layer 204 is removed, it is desired that the exposed surface area of the stress-relief layer 212 be kept to a minimum in order to prevent excessive downward recession of the stress-relief layer 212 (i.e., the top of the stress-relief layer 212 in the highlighted region B' should be maintained well above the surface of the substrate 200 ).

Referring now to TABLE 1, the rates (Å/min) at which the trench masking layer 204, stress-relief layer 212, recess-inhibiting layer 210 and trench isolation layer 214 are etched when phosphoric acid or LAL200 is used as a wet etchant, are illustrated. As will be understood by those skilled in the art, phosphoric acid selectively etches silicon nitride at a faster rate than silicon oxide and LAL200selectively etches silicon oxide at a faster rate than silicon nitride. In this TABLE 1, the trench masking layer 204 and stress-relief layer 212 comprise silicon nitride, the recess-inhibiting layer 210 comprises a thermal oxide and the trench isolation layer 210 comprises USG. The etching rate for the stress-relief layer 212 corresponds to a layer having a thickness of 70 Å.

TABLE 1

| Layer Etchant | Masking layer (204) | Stress-relief layer (212) | Recess-inhibiting layer (210) | Trench isolation layer (214) |
|---|---|---|---|---|
| phosphoric acid | 52.3 | 21.6 | 2 | 3 |
| LAL200 | 3 | ≈0 | 218 | 330 |

After the etching step to remove the trench masking layer 204 is performed, another etch back step is performed to planarize the trench isolation layer 214 and the recess-inhibiting layer 210 and remove the pad oxide layer 202. This etch back step may be performed using a wet etchant such as LAL200. As illustrated by the highlighted region C', this etch back step is performed without the presence of any remaining recesses (e.g., dents) in the stress-relief layer 212 that extend below the surface of the substrate 200 or extend between active portions of the substrate 200 and the trench isolation layer 214.

Figure 18:
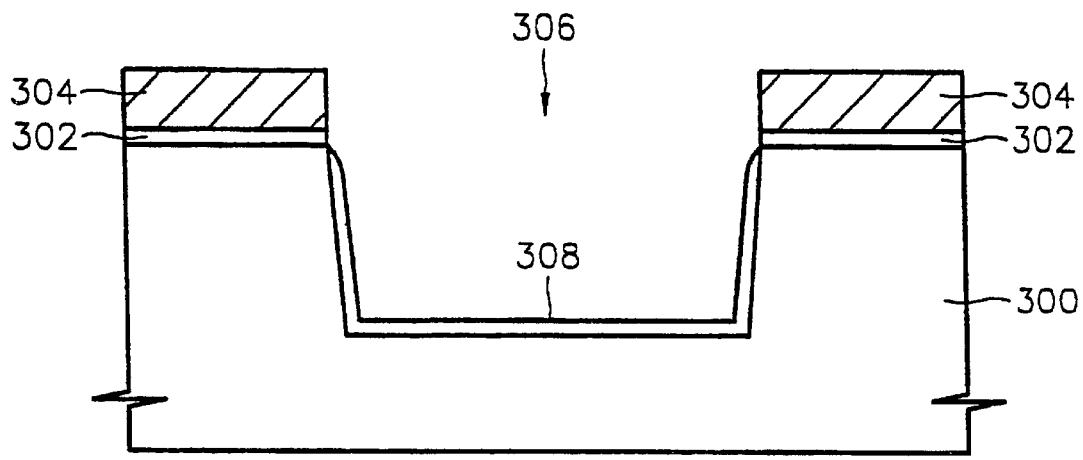
FIGS. 18–21 are cross-sectional views of intermediate structures that illustrate methods of forming trench isolation regions according to a third embodiment of the present invention.
Figure 19:
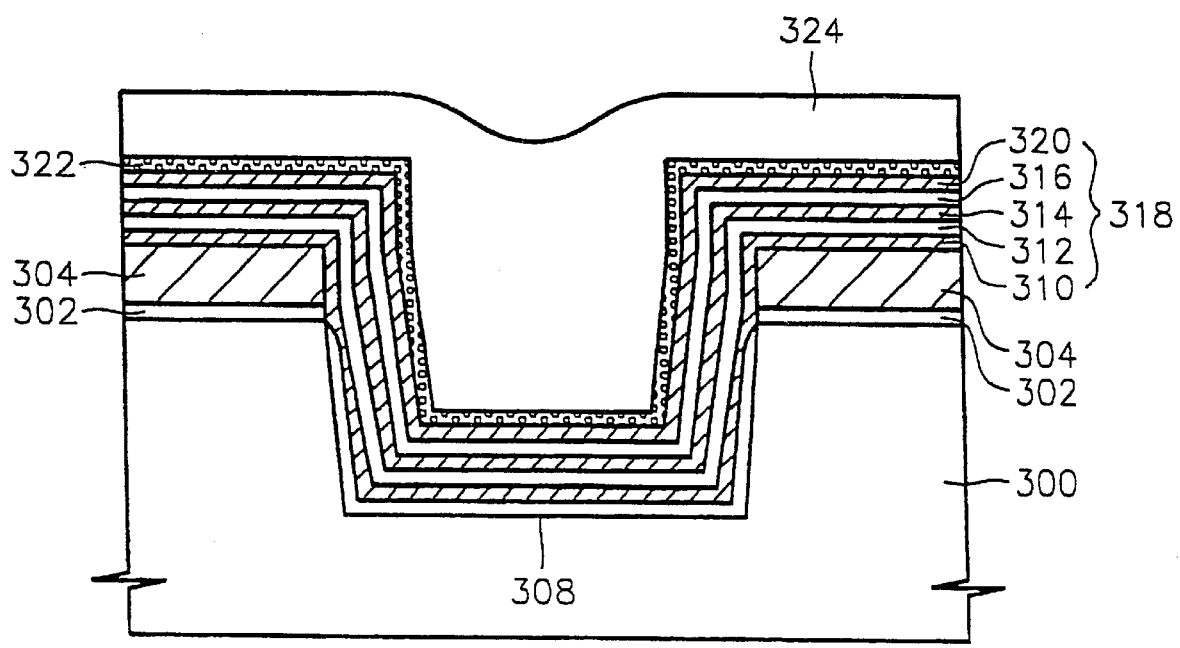

Now referring to FIGS. 18–21, methods of forming trench isolation regions according to a third embodiment of the present invention will be described. In this embodiment, multiple thin stress-relief layers are formed in a trench isolation region. The use of multiple layers can provide the benefit of substantial stress relief and the use of thin layers inhibits the rate at which these layers will be etched back when a wet etching step is performed to remove the trench masking layer, however, the use of many alternating layers may increase the manufacturing costs to unacceptable levels. FIG. 18 illustrates the steps of forming a pad oxide layer 302 and trench masking layer 304 on the substrate 300 and then forming a trench 306 in the substrate 300 using steps similar to those described above with respect to the first and second embodiments of the present invention. To remove etching defects from the bottom and sidewalls of the trench 306, a thin layer of oxide 308 (e.g.,100 Å) may be formed in the trench 306 by thermally oxidizing the bottom and sidewalls of the trench 306. Then, as illustrated by FIG. 19, a composite liner layer 318 is formed in the trench 306, as illustrated. This composite liner layer 318 may comprise a plurality of alternating recess-inhibiting oxide layers and stress-relief nitride layers. For example, first, second and third stress-relief nitride layers 310, 314 and 320 are formed in alternating sequence with first and second recess-inhibiting oxide layers 312 and 316. The stress-relief nitride layers 310, 314 and 320 and the recess-inhibiting oxide layers 312 and 316 may have thicknesses in a range between about 10 Å and 50 Å. After these layers have been deposited, an HTO oxide layer 322 preferably is formed on the third stress-relief nitride layer 320. The characteristics of the HTO oxide layer 322 may also be improved by exposing the HTO oxide layer 322 to plasma processing.

Referring still to FIG. 19, a relatively thick blanket trench isolation layer 324 is then deposited. This trench isolation layer 324 may comprise an undoped silicate glass (USG) layer, a tetraethylorthosilicate (TEOS) glass layer, a high density plasma (HDP) oxide layer, a monosilane ($SiH_4$)-based CVD oxide layer and combinations thereof. After deposition of the trench isolation layer 324, an annealing step is preferably performed to densify the trench isolation layer 324 and make it less susceptible to being etched at too fast a rate by chemical etchants such as hydrofluoric acid (HF) or phosphoric acid ($H_3PO_4$). This annealing step is preferably performed at a temperature in a range between about 800° C. and 1150° C.

Figure 20:
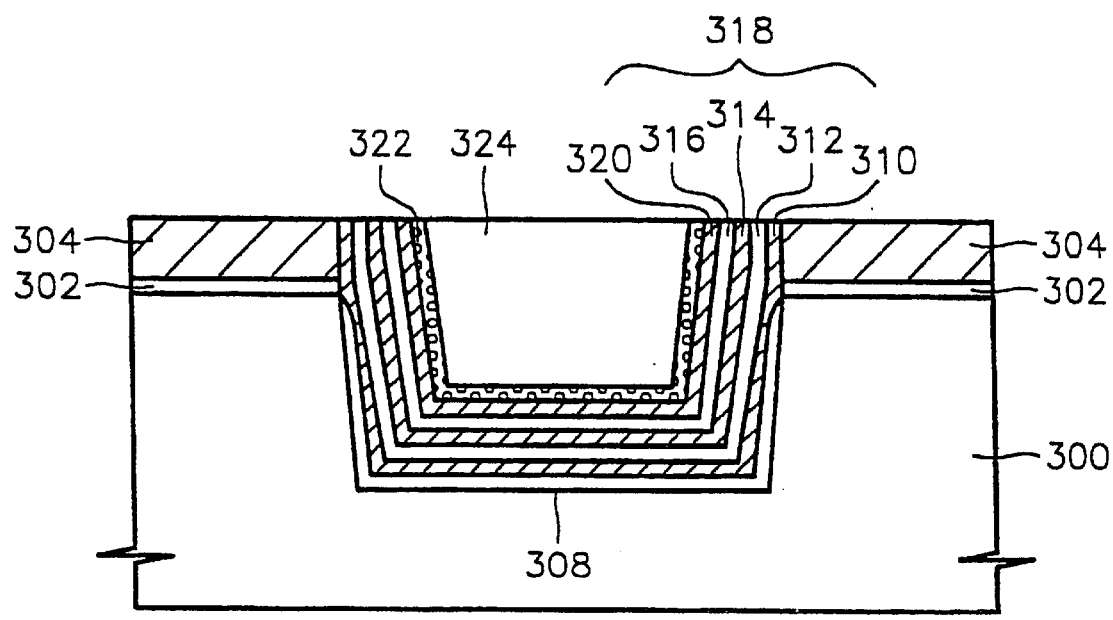
Figure 21:
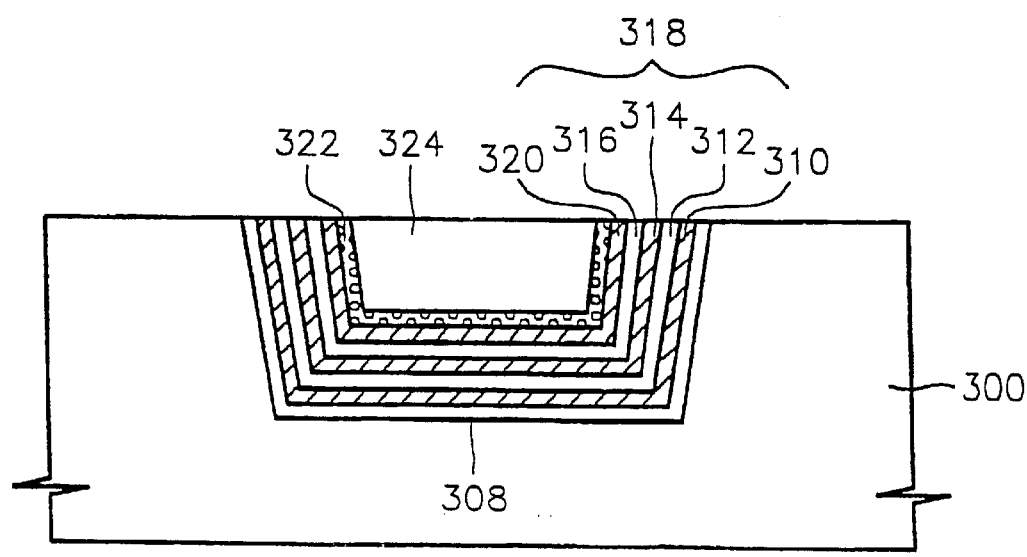

Then, as illustrated by FIG. 20, conventional planarization techniques, such as CMP, may be performed to etch-back the trench isolation layer 324 and expose the trench masking layer 304. A wet etching step using phosphoric acid may then be performed on the structure of FIG. 20 to selectively remove the trench masking layer 304 but not appreciably etch the thin stress-relief nitride layers. As illustrated by FIG. 21, another etch back step may then be performed by selectively etching the trench isolation layer 324, the recess-inhibiting oxide layers and the pad oxide layer 302 in a preferred manner to expose the surface of the substrate 300. As described more fully hereinbelow with respect to FIG. 5, the stress-relief nitride layers may be formed as a plurality of thin layers in order to reduce the likelihood of recess (or dent) formation within the resulting trench isolation region without reducing the total amount of stress-relief provided within the trench isolation region.

Figure 5:
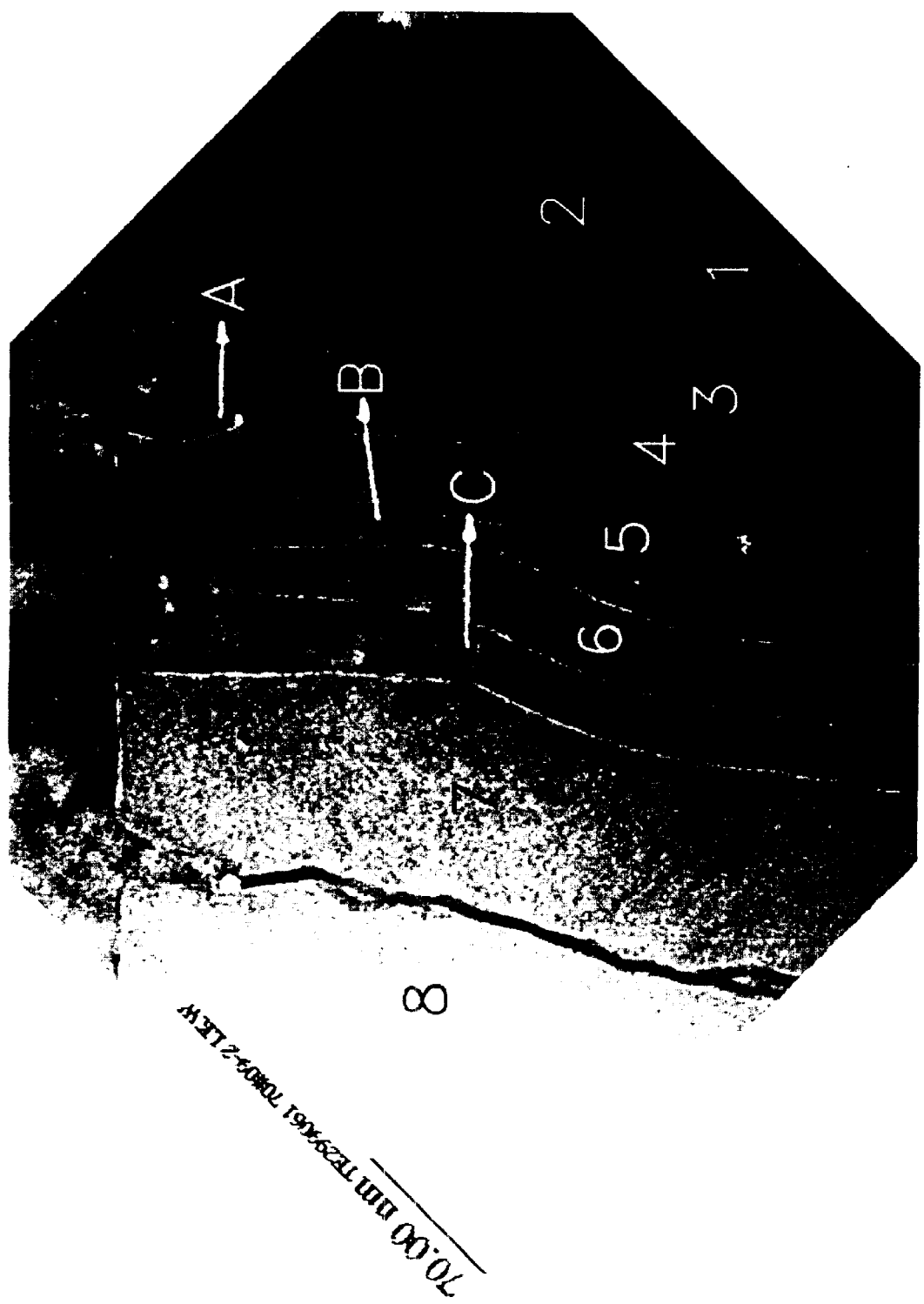
FIG. 5 is a transmission electron microscope (TEM) photograph of a trench isolation region having an alternating sequence of stress-relieving nitride layers and recess-inhibiting oxide layers therein.

FIG. 5 is a transmission electron microscope (TEM) photograph that illustrates advantages of using a plurality of thin stress-relief nitride layers in a trench isolation region. As illustrated, a mask pattern 2 comprised of a nitride film is formed on a semiconductor substrate 1 on which a pad oxide film has been formed. The semiconductor substrate is etched to form a trench, using the mask pattern 2, as an etching mask. Next, thermal oxidation is performed to form a trench internal oxide film 3 having a thickness of 110 Å. A first nitride liner (a black layer between the reference numerals 3 and 4) is formed to a thickness of 55 Å. A 500 Å-thick first CVD oxide layer 4 (e.g., a high temperature oxide (HTO) layer), a 55 Å second nitride liner (a black layer between layers 4 and 5), a second 500 Å HTO layer 5, a third 100 Å nitride liner (a black layer between the layers 5 and 6), a third 500 Å HTO layer 6, and a fourth 200 Å nitride liner (a black layer between the layer 6 and a layer 7) are sequentially formed. Then, an undoped silicate glass (USG) layer 7 is deposited to a thickness of 1000 Å, and a fifth nitride liner (a black layer between the layer 7 and a layer ) is deposited to a thickness of 55 Å. Finally, an isolation layer 8 is deposited on the resultant structure. The isolation layer 8 is formed by depositing a USG film and a plasma-enhanced tetraethylorthosilicate (PE-TEOS) film. A CMP step is performed using the mask pattern 2 as a polishing stopper, thereby planarizing the isolation layer 8.

After the CMP step, the mask pattern 2 comprised of a nitride film has a thickness of 2000 Å. Then, a wet etching process using a phosphoric acid solution is formed so that the mask pattern 2 is etched by about 1700 Å. At this point, illustrated by FIG. 5, the extent to which the second, third and fourth nitride layers (having different thicknesses) have become recessed can be observed. The second 55 Å nitride liner layer (the black layer between the layers 4 and 5) was etched by 500 Å (point A in FIG. 5) while the mask pattern 2 was etched by 1700 Å. The third 100 Å nitride liner layer was etched by 1200 Å point B in FIG. 5), and the fourth 200 Å nitride liner layer was etched by 1600 Å (point C in FIG. 5), an amount almost equal to the degree to which the mask pattern 2 was etched.

Thus, it can be ascertained that when the nitride liner layer is formed to a thickness of about 200 Å or less and is inserted between the oxide layers, its etch rate becomes significantly lower than the etch rate of the nitride mask pattern 2. This advantage can be realized to an even greater extent if the first recess-inhibiting oxide layer is formed directly on the sidewall of the mask pattern, as illustrated more fully hereinbelow with respect to FIGS. 22–24.

Figure 22:
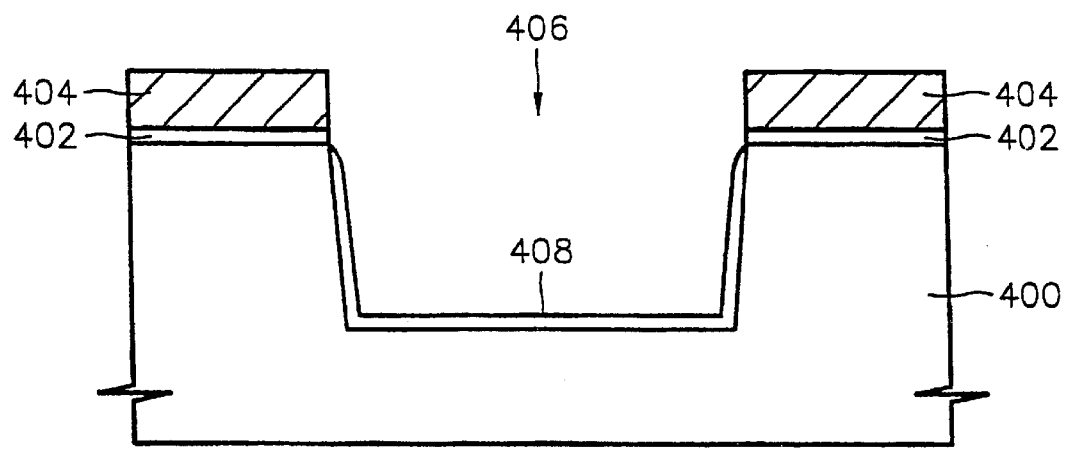
FIGS. 22–24 are cross-sectional views of intermediate structures that illustrate methods of forming trench isolation regions according to a fourth embodiment of the present invention.
Figure 23:
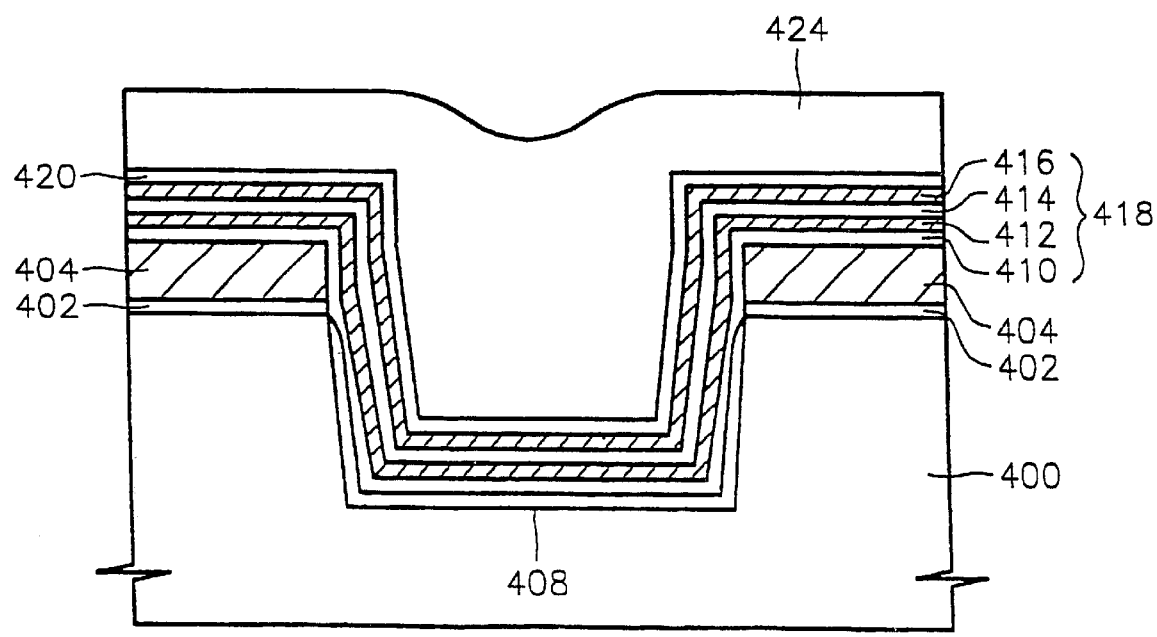
Figure 24:
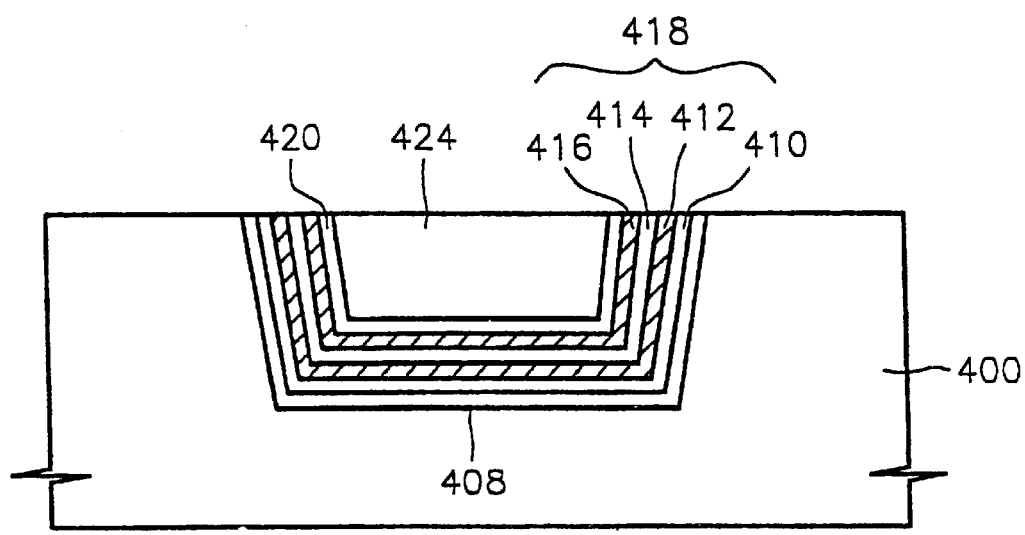

Referring now to FIGS. 22–24, preferred methods of forming trench isolation regions according to a fourth embodiment of the present invention will be described. As illustrated by these figures, methods according to the fourth embodiment are similar to the above-described methods of the third embodiment, however, the alternating sequence of the recess-inhibiting oxide layers 410 and 414 and stress-relief nitride layers 412 and 416 is reversed. In particular, the use of a first recess-inhibiting oxide layer 410 in direct contact with a sidewall of the trench masking layer 404 is more preferred (relative to the embodiment of FIGS. 18–21) because the first recess-inhibiting oxide layer 410 inhibits lateral etching of the first stress-relief nitride layer 412 when the trench masking layer 404 is being removed. In other words, it is preferable that the layer in contact with a sidewall of the trench masking layer comprise an oxide (or other material that can be etched at a very slow rate while the trench masking layer is being etched at a high rate) instead of nitride.

In particular, FIG. 22 illustrates the steps of forming a pad oxide layer 402 and trench masking layer 404 on the substrate 400 and then forming a trench 406 in the substrate 400. To remove wet etching defects from the bottom and sidewalls of the trench 406, a thin layer of oxide 408 (e.g., 100 Å) may be formed in the trench 406 by thermally oxidizing the bottom and sidewalls of the trench 406. Then, as illustrated by FIG. 23, a composite liner layer 418 is formed in the trench 406, as illustrated. This composite liner layer 418 may comprise a plurality of alternating recess-inhibiting oxide layers and stress-relief nitride layers. The first stress-relief nitride layer 412 may be formed to have a thickness as great as 300 Å, but is more preferably formed to have a thickness in a range between about 50 Å and 300 Å. After these layers have been deposited, an HTO oxide layer 420 preferably is formed on the second stress-relief nitride layer 416. The characteristics of the HTO oxide layer 420 may also be improved by exposing the HTO oxide layer 420 to plasma processing.

Referring still to FIG. 23, a relatively thick blanket trench isolation layer 424 is then deposited. After deposition of the trench isolation layer 424, an annealing step is preferably performed to densify the trench isolation layer 424 and make it less susceptible to being etched at too fast a rate by chemical etchants such as hydrofluoric acid (HF) or phosphoric acid ($H_3PO_4$). This annealing step is preferably performed at a temperature in a range between about 800° C. and 1150° C. Then, as illustrated by FIG. 24, conventional planarization techniques, such as CMP, may be performed to etch-back the trench isolation layer 424 and expose the trench masking layer 404. A wet etching step using phosphoric acid may then be performed to selectively remove the trench masking layer 404 but not appreciably etch back the stress-relief nitride layers 412 and 416. Then, as illustrated by FIG. 24, another etch back step may be performed by selectively etching the trench isolation layer 424, the recess-inhibiting oxide layers and the pad oxide layer 402 in a preferred manner to expose the surface of the substrate 400. According to this embodiment of the present invention, the use of a recess-inhibiting layer 410 in direct contact with the trench masking layer 404 and the use of a plurality of very thin stress-relief nitride layers significantly improve the electrical characteristics of the resulting trench isolation regions.

Figure 25:
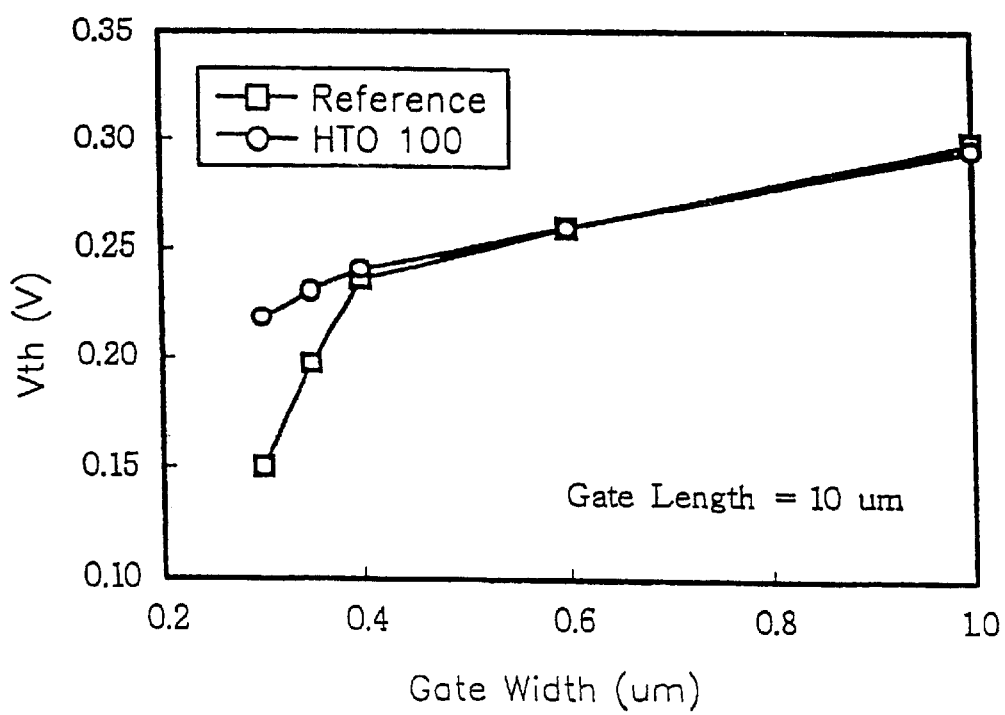
FIG. 25 is a graph of threshold voltage versus gate width for integrated MOSFET devices formed in substrates having trench isolation regions therein.

Referring now to FIGS. 25–29, improvements in the electrical characteristics of devices formed in accordance with the present invention will be illustrated by example. In particular, FIG. 25 is a graph showing the degree to which the inverse narrow width effect (INWE) improves in a semiconductor device having trench isolation regions therein that are formed in accordance with the present invention. Referring to FIG. 25, a short channel effect (SCE) and the INWE are mainly referred to for estimating the performance of a transistor. The SCE is a variation in threshold voltage according to a reduction in the gate length for a transistor having a constant-width gate, and the INWE is a variation in threshold voltage according to a reduction in the gate width for a transistor having a constant-length gate. As will be understood by those skilled in the art, the INWE is strongly influenced by the profile of the boundary surface between an active region and an adjacent trench isolation layer. For example, the threshold voltage Vth of a LOCOS-type isolation layer increases in a transistor having a small-width gate. The threshold voltage of a trench isolation layer decreases with a reduction in the width of a gate. That is, the threshold voltage Vth of the LOCOS isolation layer is increased since a gate oxide layer on the edge of the active region becomes thick due to a bird's beak formation. The threshold voltage Vth of the trench isolation layer is decreased with a reduction in the width of a gate, since a large electrical field is applied to the edge of the isolation layer which is recessed. It is preferable that transistors have no SCE or INWE. INWE becomes more severe as dents or grooves in trench isolation regions become more pronounced.

The X and Y axes in the graph of FIG. 25 denote a gate width ($\mu$m) and a threshold voltage (V), respectively. In a sample, the gate length is fixed to 10 $\mu$m. The curve connecting several -□- symbols denotes a characteristic curve when a nitride liner layer is formed immediately after a trench internal oxide layer is formed without using a dent free layer as in the prior art. The curve connecting several -○-symbols denotes a characteristic curve when a CVD oxide layer, for example, an HTO layer is deposited as a recess-inhibiting layer (also referred to as a dent-free layer) to a thickness of 100 Å and trench isolation is then performed, before the nitride liner layer is deposited, as in the first embodiment of the present invention. As can be seen from this graph, the INWE is improved, and the above profile is improved by preventing a structural defect such as a dent or groove from being formed on the boundary surface between the active region and the isolation layer.

Figure 26:
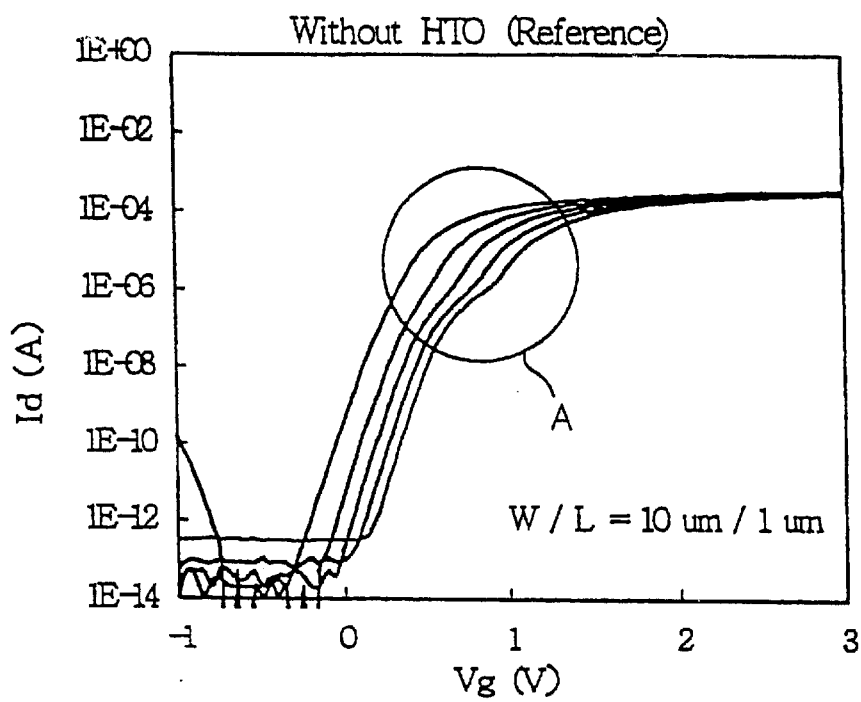
FIG. 26 is a graph of drain current versus gate voltage for integrated MOSFET devices formed in substrates having conventional trench isolation regions therein.
Figure 27:
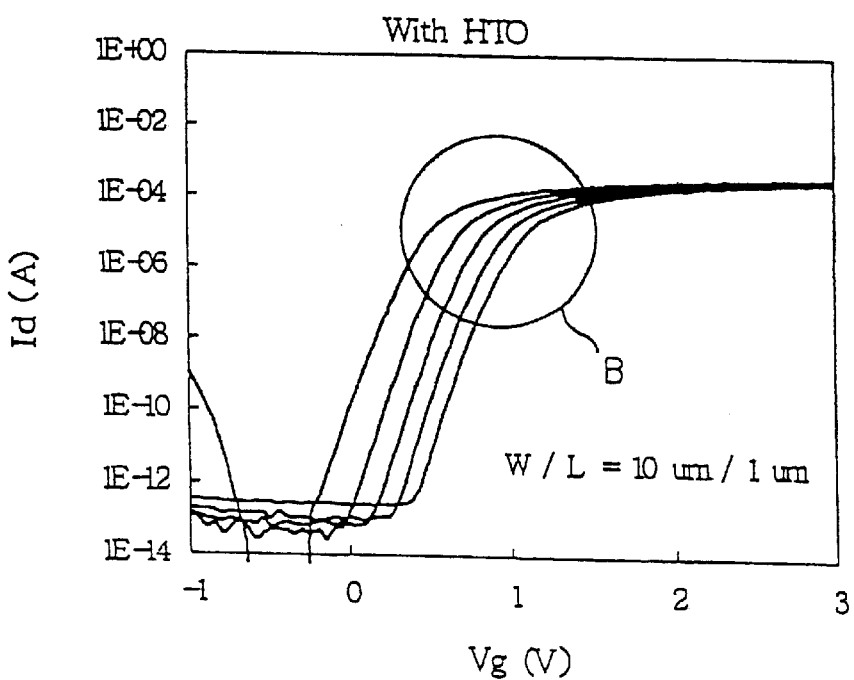
FIG. 27 is a graph of drain current versus gate voltage for integrated MOSFET devices formed in substrates having trench isolation regions with recess-inhibiting oxide layers therein.

FIG. 26 is a graph showing the relationship between the gate voltage (Vg) and the drain current (Id) when a nitride liner layer is deposited without forming a dent free layer (as in the prior art). FIG. 27 is a graph showing the relationship between the gate voltage (Vg) and the drain current (Id) when a CVD oxide layer is deposited to a thickness of 100 Å and used as a dent free layer as in the first embodiment of the present invention.

Referring to FIGS. 26 and 27, the gate width of a transistor is 10 μm, and the gate length thereof is 1 μm. Five characteristic curves show characteristics when back bias voltages of 0V, −1V, −2V, −3V, and −4V are respectively applied in sequence from the left of the graph. It can be seen from FIG. 26 that a hump phenomenon (A) becomes serious with an increase in back bias. However, it can be seen from FIG. 27 that the hump is not generated but is improved (as illustrated by a portion B) when an oxide layer, for example, an HTO layer, is deposited to a thickness of 100 Å by CVD, and a nitride liner layer is formed as in the first embodiment of the present invention.

Figure 28:
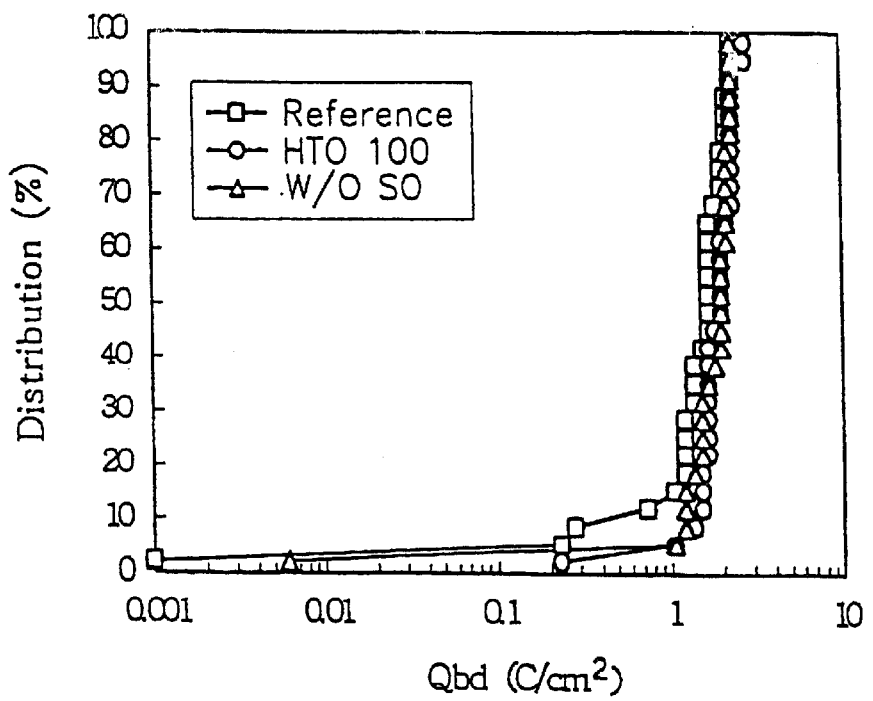
FIG. 28 is a graph of distribution versus charge for integrated circuit MOSFET devices at the onset of breakdown.
Figure 29:
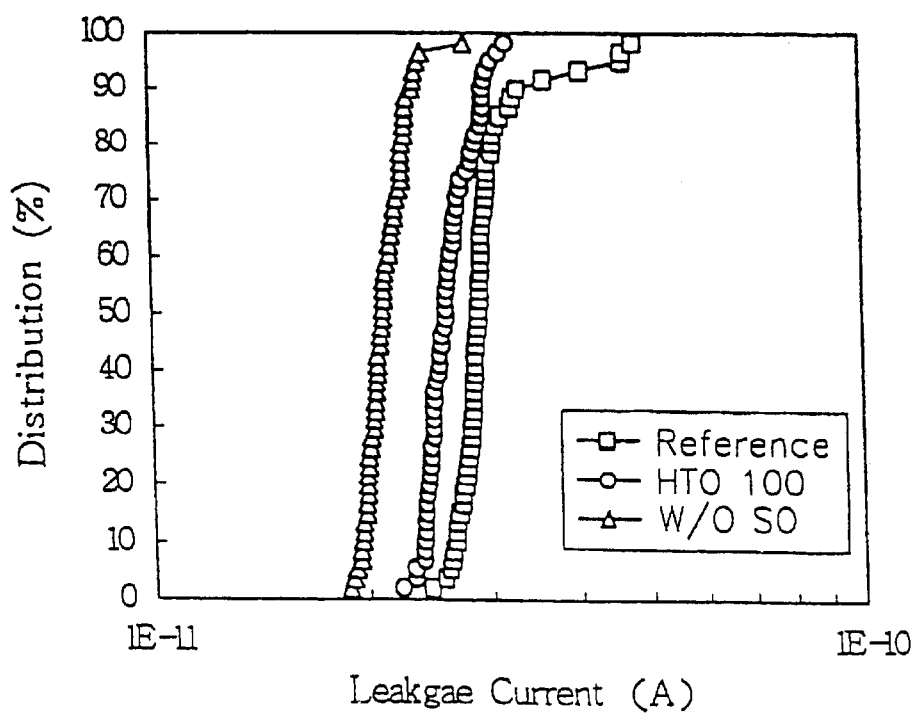
FIG. 29 is a graph of distribution versus leakage current for integrated circuit MOSFET devices at the onset of breakdown.
Figure 30A:
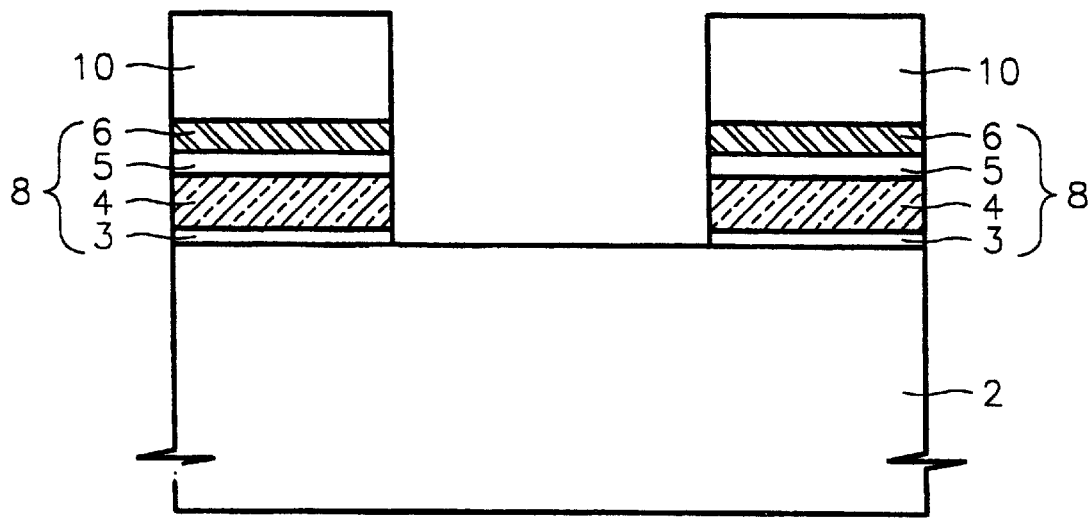
FIGS. 30A–30E are cross-sectional views of intermediate structures that illustrate conventional methods of forming trench isolation regions.
Figure 30B:
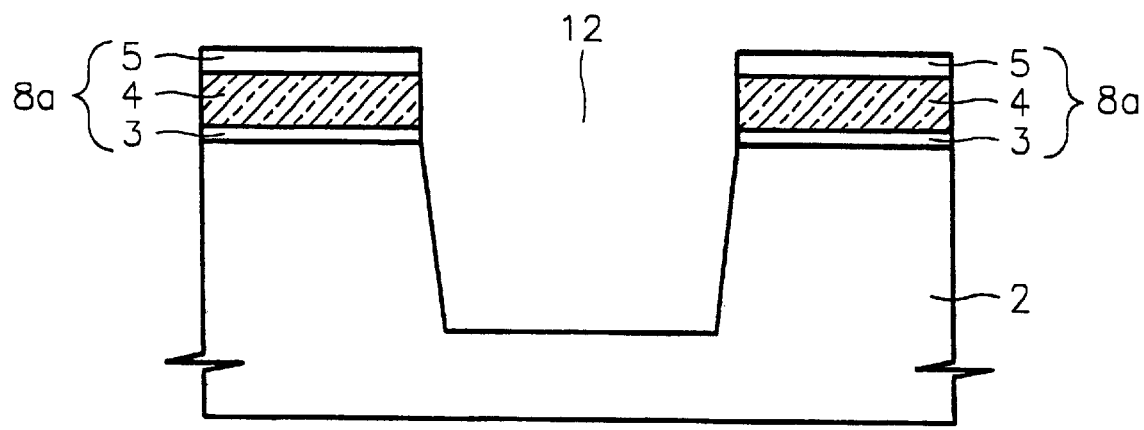
Figure 30C:
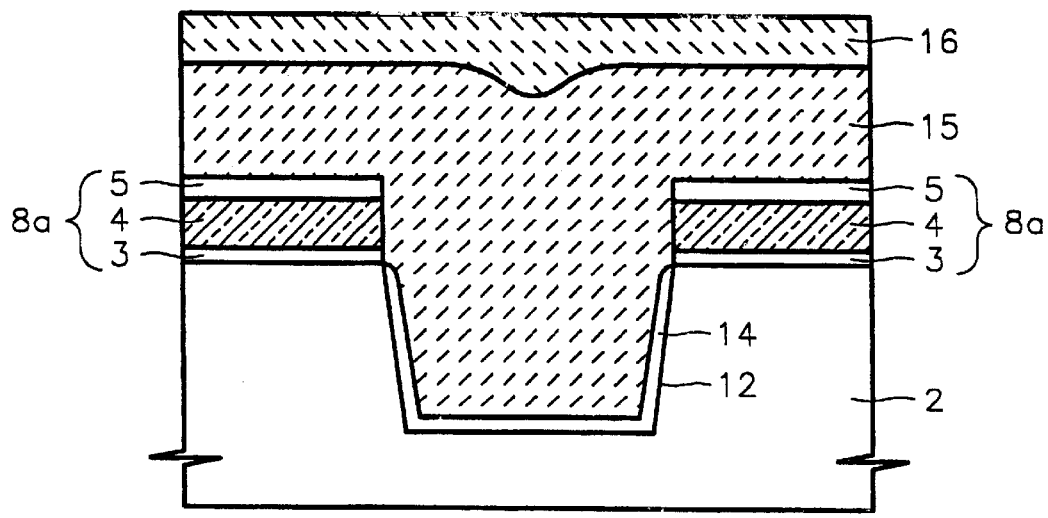
Figure 30D:
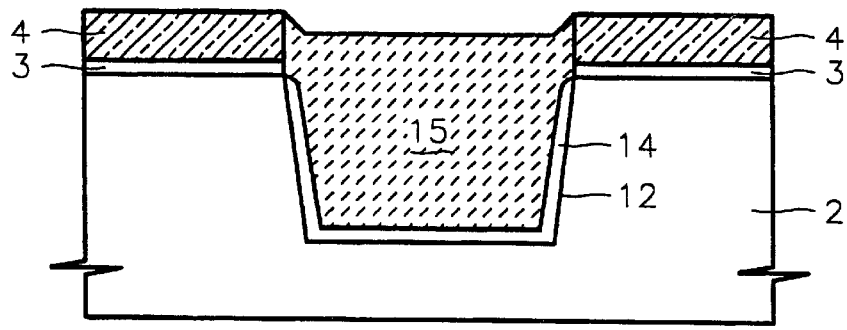
Figure 30E:
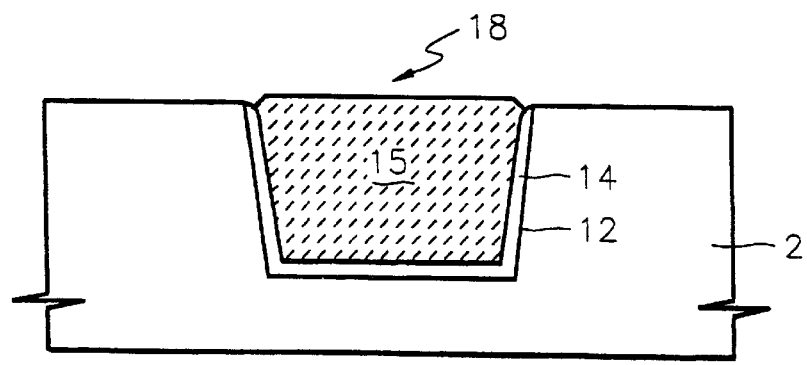

FIGS. 28 and 29 are graphs showing the degree of improvement in breakdown and junction leakage current that can be achieved when devices are formed in accordance with the first embodiment of the present invention, respectively. Referring to FIGS. 28 and 29, the X axis in FIG. 28 shows the amount of charge flowing when breakdown occurs, and the unit of the X axis are $C/cm^2$. The X axis in FIG. 29 indicates the junction leakage current in Amperes (A). The Y axes in FIGS. 28 and 29 denote the distribution (in %) with respect to a sample. In the graphs, the curve connecting several -□- symbols is a characteristics curve when a trench isolation layer is formed without forming a dent free layer as in the prior art. The curve connecting several -o- symbols is a characteristics curve when a trench internal oxide layer is formed on the inner wall of a trench, a CVD HTO layer is formed as a dent free layer, and a trench isolation layer is formed. The curve connecting several -Δ- symbols is a characteristics curve when a CVD HTO layer is formed as a dent free layer, and a trench isolation layer is formed, without forming a trench internal oxide layer on the inner wall of a trench. It can be seen from these graphs that the breakdown is excellent and the junction leakage current is not increased in the present invention in which a dent free layer is formed.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a trench isolation region, comprising the steps of:

forming a semiconductor substrate having a trench therein and a masking layer thereon extending adjacent the trench;

forming a first recess-inhibiting layer on a sidewall of the trench and on a sidewall of the masking layer;

forming a first stress-relief layer on the first recess-inhibiting layer, said first stress-relief layer extending opposite the sidewall of the trench and opposite the sidewall of the masking layer, wherein said forming a first stress-relief layer includes forming a silicon layer on the sidewall of the trench and on the sidewall of the masking layer, and converting the silicon layer into a silicon dioxide layer by oxidizing the silicon layer;

forming a trench isolation layer on the first stress-relief layer; and removing at least a portion of the masking layer using a first etchant that selectively etches the masking layer and the first stress-relief layer at faster rates than the first recess-inhibiting layer.

2. A method of forming a trench isolation region, comprising the steps of:

forming a semiconductor substrate having a trench therein and a masking layer thereon extending adjacent the trench;

thermally oxidizing the sidewall and bottom of the trench;

forming a first recess-inhibiting layer on a sidewall of the trench and on a sidewall of the masking layer;

forming a first stress-relief layer on the first recess-inhibiting layer, said first stress-relief layer extending opposite the sidewall of the trench and opposite the sidewall of the masking layer;

removing at least a portion of the masking layer using a first etchant that selectively etches the masking layer and the first stress-relief layer at faster rates than the first recess-inhibiting layer; and exposing the first recess-inhibiting layer and the trench isolation layer to a second etchant that selectively etches the first recess-inhibiting layer and the trench isolation layer at faster rates than the first stress-relief layer.

3. A method of forming a trench isolation region, comprising the steps of:

forming a semiconductor substrate having a trench therein and a silicon nitride masking layer thereon surrounding the trench;

forming a silicon layer on the sidewall of the trench and on a sidewall and upper surface of the masking layer;

converting the silicon layer into a silicon dioxide recess-inhibiting layer;

forming a silicon nitride stress-relief layer on the recess-inhibiting layer;

forming a trench isolation layer on the stress-relief layer;

removing the masking layer using a first etchant that selectively etches the masking layer and the stress-relief layer at faster rates than the recess-inhibiting layer; and etching the trench isolation layer using a second etchant that selectively etches the trench isolation layer and the recess-inhibiting layer at faster rates than the stress-relief layer.

4. The method of claim 3, wherein said removing step is preceded by the step of planarizing the trench isolation layer using the masking layer as a planarization stop.

5. The method of claim 3, wherein the silicon nitride stress-relief layer has a thickness of less than about 100 Å.

6. The method of claim 5, wherein said step of forming a trench isolation layer is preceded by the steps of:

forming a second recess-inhibiting layer comprising silicon dioxide on the stress-relief layer; and forming a second stress-relief layer comprising silicon nitride on the second recess-inhibiting layer.

7. The method of claim 6, wherein the second stress-relief layer has a thickness of less than about 100 Å.

* * * * *